United States Patent
Lowrey

(10) Patent No.: US 7,319,057 B2
(45) Date of Patent: Jan. 15, 2008

(54) PHASE CHANGE MATERIAL MEMORY DEVICE

(75) Inventor: Tyler A. Lowrey, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 453 days.

(21) Appl. No.: 10/020,757

(22) Filed: Oct. 30, 2001

(65) Prior Publication Data

US 2003/0082908 A1 May 1, 2003

(51) Int. Cl.
H01L 21/00 (2006.01)
(52) U.S. Cl. ...................... 438/200; 438/652
(58) Field of Classification Search .......... 438/238, 438/95, 102, 133, 675, 618, 669, 735, 763, 438/128, 643, 648, 131, 132, 653, 164, 405, 438/427, 200, 652
See application file for complete search history.

(56) References Cited

U.S. PATENT DOCUMENTS

| | | | | |
|---|---|---|---|---|
| 5,411,592 A * | 5/1995 | Ovshinsky et al. | ......... | 118/718 |
| 5,952,671 A * | 9/1999 | Reinberg et al. | ............ | 257/3 |
| 6,031,287 A * | 2/2000 | Harshfield | ............ | 257/734 |
| 6,153,890 A * | 11/2000 | Wolstenholme et al. | ....... | 257/3 |
| 6,189,582 B1 * | 2/2001 | Reinberg et al. | ............ | 438/239 |
| 6,339,544 B1 * | 1/2002 | Chiang et al. | ............. | 365/163 |
| 6,429,064 B1 * | 8/2002 | Wicker | ............ | 438/238 |
| 6,440,837 B1 * | 8/2002 | Harshfield | ............ | 438/618 |
| 6,511,867 B2 * | 1/2003 | Lowrey et al. | ............ | 438/128 |
| 6,514,805 B2 * | 2/2003 | Xu et al. | ............ | 438/164 |
| 6,567,293 B1 * | 5/2003 | Lowrey et al. | ............ | 365/100 |
| 6,574,130 B2 * | 6/2003 | Segal et al. | ............ | 365/129 |
| 6,583,003 B1 * | 6/2003 | Hsu et al. | ............ | 438/238 |
| 6,613,604 B2 * | 9/2003 | Maimon et al. | ............ | 438/95 |
| 6,621,095 B2 * | 9/2003 | Chiang et al. | ............ | 257/5 |
| 6,635,951 B1 * | 10/2003 | Zahorik | ............ | 257/613 |
| 6,638,820 B2 * | 10/2003 | Moore | ............ | 438/256 |
| 6,643,165 B2 * | 11/2003 | Segal et al. | ............ | 365/151 |
| 6,674,115 B2 * | 1/2004 | Hudgens et al. | ............ | 257/310 |
| 6,757,190 B2 * | 6/2004 | Lowrey | ............ | 365/163 |
| 6,770,524 B2 * | 8/2004 | Chiang et al. | ............ | 438/238 |
| 6,774,387 B2 * | 8/2004 | Maimon | ............ | 257/2 |
| 6,777,705 B2 * | 8/2004 | Reinberg et al. | ............ | 257/2 |
| 6,815,705 B2 * | 11/2004 | Klersy et al. | ............ | 257/3 |
| 6,833,559 B2 * | 12/2004 | Moore | ............ | 257/52 |
| 6,836,423 B2 * | 12/2004 | Lowrey et al. | ............ | 365/100 |
| 6,836,424 B2 * | 12/2004 | Segal et al. | ............ | 365/129 |
| 6,849,868 B2 * | 2/2005 | Campbell | ............ | 257/35 |
| 6,856,002 B2 * | 2/2005 | Moore et al. | ............ | 257/529 |
| 6,878,569 B2 * | 4/2005 | Li | ............ | 438/95 |
| 6,881,623 B2 * | 4/2005 | Campbell et al. | ............ | 438/257 |
| 6,909,107 B2 * | 6/2005 | Rodgers et al. | ............ | 257/3 |
| 6,919,592 B2 * | 7/2005 | Segal et al. | ............ | 257/209 |
| 6,972,428 B2 * | 12/2005 | Maimon | ............ | 257/2 |
| 6,998,289 B2 * | 2/2006 | Hudgens et al. | ............ | 438/95 |
| 6,998,697 B2 * | 2/2006 | Campbell et al. | ............ | 257/529 |

(Continued)

Primary Examiner—Laura M. Schillinger
(74) Attorney, Agent, or Firm—Trop, Pruner & Hu, P.C.

(57) ABSTRACT

A lower electrode may be covered by a protective film to reduce the exposure of the lower electrode to subsequent processing steps or the open environment. As a result, materials that may have advantageous properties as lower electrodes may be utilized despite the fact that they may be sensitive to subsequent processing steps or the open environment.

4 Claims, 4 Drawing Sheets

U.S. PATENT DOCUMENTS

| | | |
|---|---|---|
| 7,030,410 B2 * | 4/2006 | Moore .................... 257/52 |
| 7,042,001 B2 * | 5/2006 | Kim et al. ................ 257/3 |
| 7,061,071 B2 * | 6/2006 | Gilton .................... 257/529 |
| 7,106,096 B2 * | 9/2006 | Zhu et al. ................ 326/37 |
| 7,109,056 B2 * | 9/2006 | Klein ..................... 438/95 |
| 2001/0002046 A1 * | 5/2001 | Reinberg et al. ......... 257/3 |
| 2003/0059526 A1 * | 3/2003 | Benson et al. ............ 427/121 |
| 2004/0051157 A1 * | 3/2004 | Moore .................... 257/489 |
| 2005/0019699 A1 * | 1/2005 | Moore .................... 430/311 |
| 2005/0169070 A1 * | 8/2005 | Reinberg et al. ......... 365/200 |
| 2006/0163553 A1 * | 7/2006 | Liang .................... 257/3 |
| 2007/0040159 A1 * | 2/2007 | Wang .................... 257/3 |

* cited by examiner

PHASE CHANGE MATERIAL MEMORY DEVICE

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

In some embodiments, the cell may have a large number of states. That is, because each state may be distinguished by its resistance, a number of resistance determined states may be possible, allowing the storage of multiple bits of data in a single cell.

A variety of phase change alloys are known. Generally, chalcogenide alloys contain one or more elements from Column VI of the periodic table. One particularly suitable group of alloys is the GeSbTe alloys.

A phase change material may be formed within a passage or pore through an insulator. The phase change material may be coupled to upper and lower electrodes on either end of the pore.

One problem that arises with existing lower electrodes is that some suitable lower electrode materials that have advantageous properties cannot be used because they may be adversely affected by necessary subsequent processing steps or upon exposure to the open environment. Among the advantageous attributes of the lower electrode material is good electrical contact to phase change materials and effective resistive heating to promote more efficient phase change programming.

Thus, there is a need for better designs for phase change memories that may be manufactured using more advantageous techniques.

DETAILED DESCRIPTION

Figure 1:
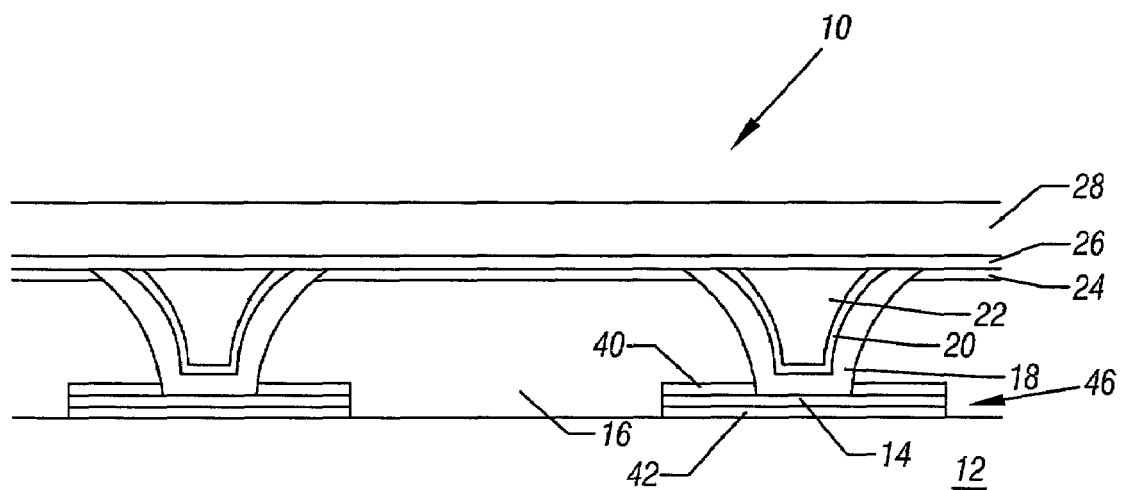
FIG. 1 is an enlarged, cross-sectional view in accordance with one embodiment of the present invention.

Referring to FIG. 1, a phase change memory cell 10 may be formed on a substrate 12 that in one embodiment may be a silicon substrate. A pair of lower electrodes 14 may be formed over the substrate 12. The electrodes 14 may be separated by an insulator 16. Furthermore, the electrodes 14 may be covered by a protective film 40. In some embodiments, an optional base material 42 may be formed over the substrate so that the electrode 14 is sandwiched between the base material 42 on the bottom and the protective film 40 on the top.

A pore may be formed above the lower electrode 14 between the lower electrode 14 and the top electrode 28. The pore may include a tapered, cup-shaped phase change material 18 covered by a similarly shaped barrier layer 20. A fill insulator 22 may fill the central portion of the barrier 20 and the phase change material 18. An etch stop layer 24 underlies a barrier layer 26 that in turn underlies the top electrode 28.

Figure 3:
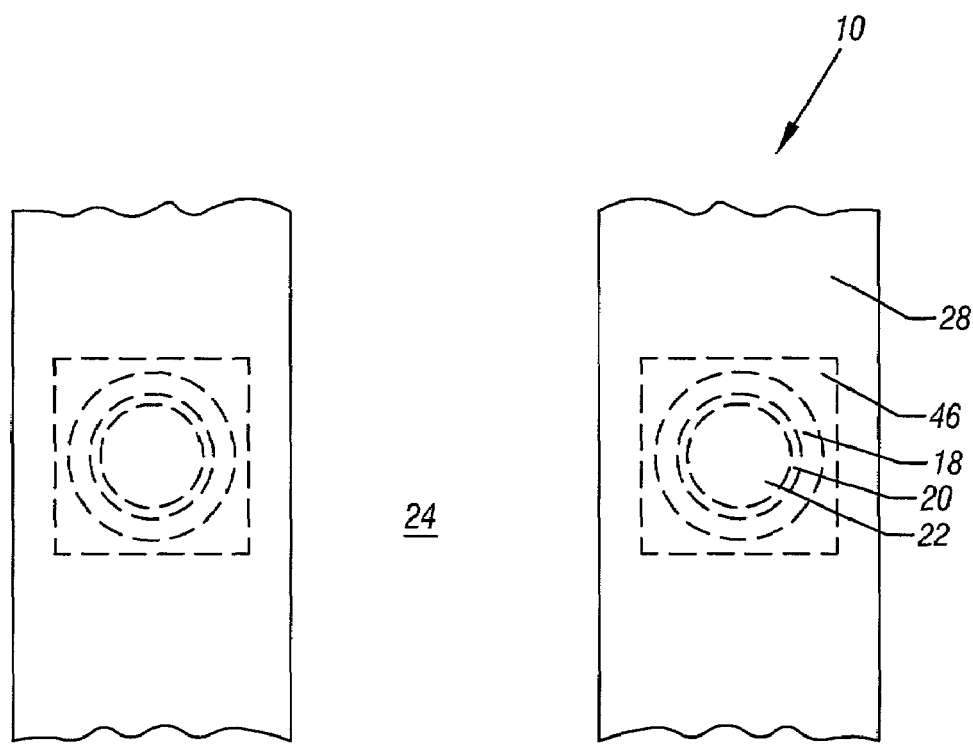
FIG. 3 is a top plan view of the embodiment shown in FIGS. 1 and 2.

Referring to FIG. 1, the top electrode 28 extends along at least two adjacent pores. The pores may be separated by an insulator 16. Cells defined by the pores may be distributed in large numbers across the substrate 12 in some embodiments. As viewed from above in FIG. 3, each electrode 28 covers a plurality of pores including the elements 14, 18, 20 and 22, separated by insulator 16 covered by an etch stop layer 24.

Figure 4:
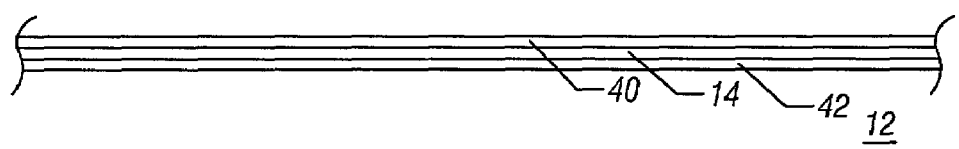
FIG. 4 is an enlarged cross-sectional view of the initial processing of the structure of FIG. 1 in accordance with one embodiment of the present invention.

A technique for forming the memory cells 10, according to one embodiment, may involve initially forming the lower electrodes 14 on a substrate 12 using conventional patterning and deposition techniques, as shown in FIG. 4.

Referring to FIG. 4, a base layer 42 may be deposited on top of the substrate 12 in some embodiments of the present invention. In other embodiments, the base layer 42 may not be utilized. The base layer 42 may be made of material such as cobalt silicide, titanium tungsten or another conductive material.

The lower electrode 14 may be formed over the base layer 42 if utilized. Finally, a protective film 40 may be formed over the electrode 14. The lower electrode 14 may be any of a variety of conductive materials including carbon. The protective film 40 may be chosen from a variety of insulating materials including $SiO_2$, $Si_3N_4$ or $Al_2O_3$. In general, the protective material may also be any material in the form $Si_xN_y$, where x and y represent the stoichiometry and an advantageous stoichiometry is where x is equal to three and y is equal to four.

The base layer 42, lower electrode 14 and a protective film 40 may be formed sequentially. Advantageously, the lower electrode 14 and the protective film 40 are formed in situ, for example in the same deposition chamber without venting back to atmosphere.

Figure 5:
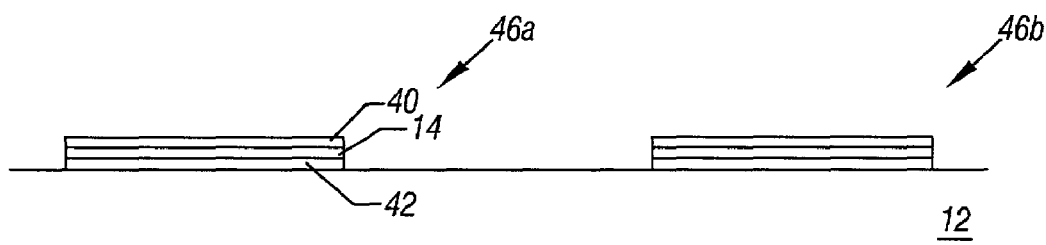
FIG. 5 shows subsequent processing on the structure shown in FIG. 4 in accordance with one embodiment of the present invention.

Referring to FIG. 5, the structure shown in FIG. 4 may then be subjected to patterning to form the stacks 46a and 46b. Alternatively, each of the three layers 14, 40 and 42 may be separately patterned.

Figure 6:
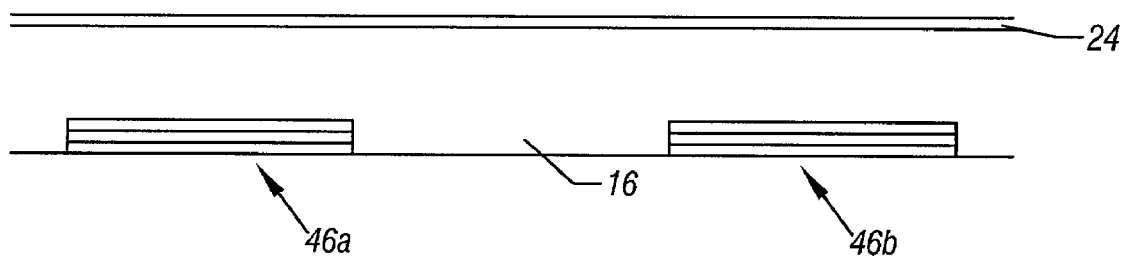
FIG. 6 shows subsequent processing of the structure shown in FIG. 5 in accordance with one embodiment of the present invention.

Referring to FIG. 6, the insulator 16 may then be deposited over the patterned lower electrode stacks 46. In one embodiment, the insulator 16 is an electrical and thermal insulator. One suitable material is silicon dioxide that may be from about 50 to 1500 Angstroms thick in one embodiment. Next a planarization such as, for example, a chemical mechanical planarization (CMP) is performed to achieve global and local planarity. This may be followed by the deposition, if desired, of a CMP etch stop layer 24. The layer 24 may be silicon nitride or polysilicon having a thickness from 10 to 1000 Angstroms in one embodiment.

Figure 7:
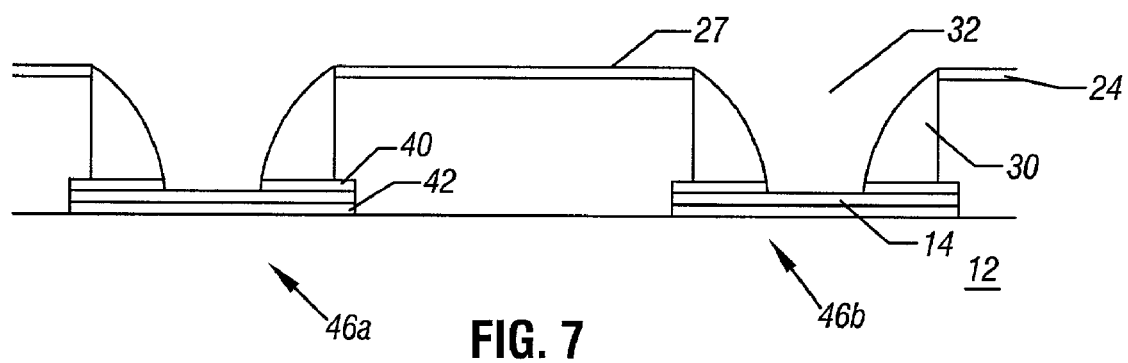
FIG. 7 shows subsequent processing of the embodiment shown in FIG. 6 in accordance with one embodiment of the present invention.

Referring next to FIG. 7, the pore openings 32, defined through the etch stop layer 24 and protective film 40, receive a side wall spacer 30. The side wall spacer 30 may be formed using standard techniques of depositing an insulating layer and selectively anisotropically dry etching that layer down to the lower electrode 14. The insulating spacer 30 may be made of silicon dioxide or nitride such as $Si_3N_4$. The thickness of the insulating spacer 30 may be in the range of 50 to 2000 Angstroms in one embodiment.

Figure 8:
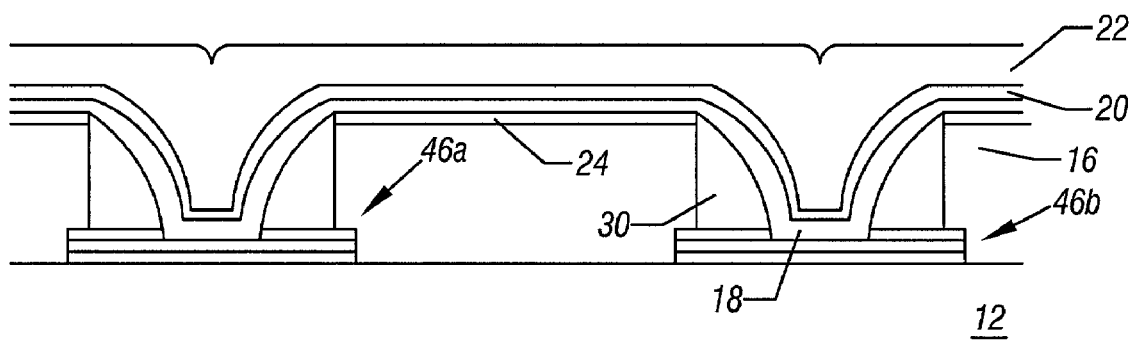
FIG. 8 shows subsequent processing of the embodiment shown in FIG. 7 in accordance with one embodiment of the present invention.

Turning next to FIG. 8, deposited in a sequential fashion over the structure shown in FIG. 7 may be the phase change layer 18, barrier layer 20, and fill insulator 22, in one embodiment. The phase change material 18 may be a chalcogenide-based material such as $Ge_2Sb_2Te_5$ with a thickness of 50 to 1000 Angstroms in one embodiment. The barrier material 20 may be, for example, titanium, titanium nitride or titanium-tungsten, for example, with a thickness in the range of 10 to 500 Angstroms. The fill insulator 22 may be any insulator with low thermal and electrical conductivity. Examples of suitable fill insulator 22 materials include silicon dioxide or silicon nitride, such a $Si_3N_4$ with a thickness of about 500 to 10,000 Angstroms, for example.

Figure 9:
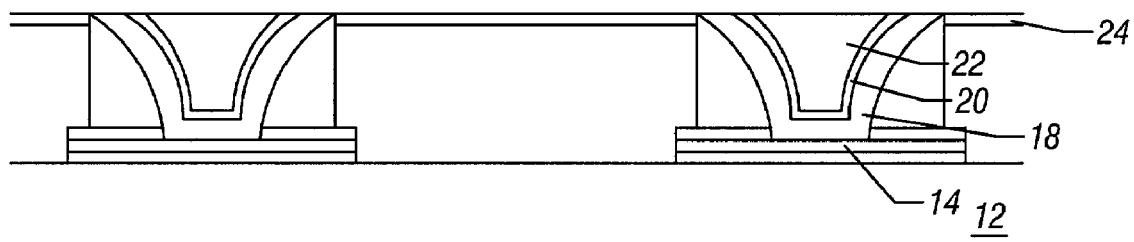
FIG. 9 shows subsequent processing of the embodiment shown in FIG. 8 in accordance with one embodiment of the present invention.

Turning finally to FIG. 9, CMP removes the fill insulator 22, barrier layer 20, and phase change material 18 in all regions above the etch stop layer 24. CMP thereby defines the structure of the phase change material 18 while eliminating the need for a dry etch in one embodiment. As mentioned earlier, the use of the dry etch may complicate the process flow and raise issues of undercut and re-entrant profiles. Moreover, because the phase change material 18 is defined within an encapsulated, singulated region, the problem of adhesion between the phase change material 18 and the surrounding materials may be substantially reduced or even eliminated, even after exposure to ensuing thermal stresses.

The imposition of the insulator 22 over the phase change material 18 reduces upward thermal losses. Thermal losses may result in the need for greater programming currents to obtain the same programming effect.

Figure 2:
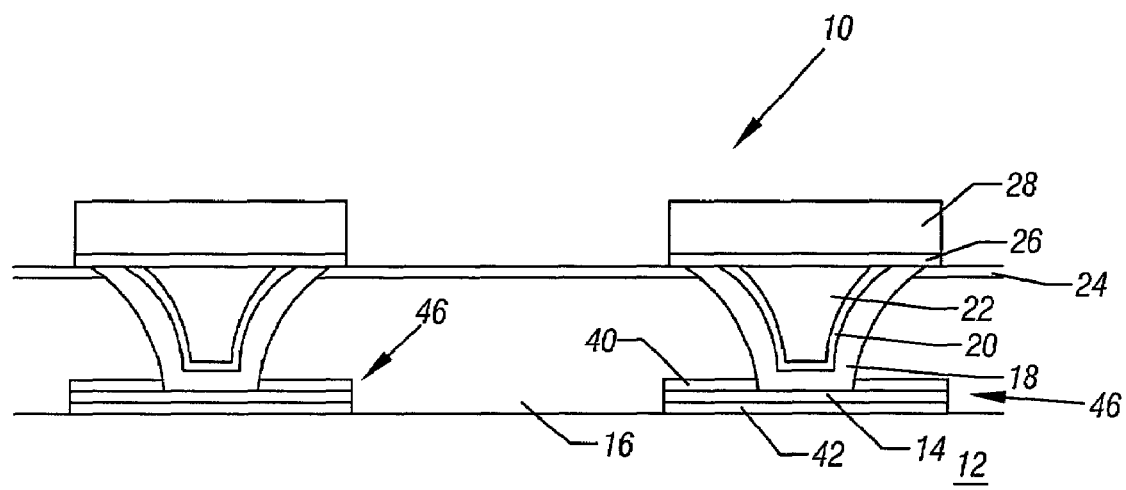
FIG. 2 is an enlarged, cross-sectional view of the device shown in FIG. 1 taken transversely to the view shown in FIG. 1.

As shown in FIG. 1, the structure of FIG. 9 may be covered with a barrier layer 26 and a top electrode 28. In one embodiment, the barrier layer 26 may be titanium, titanium nitride, or titanium-tungsten at a thickness in the range of 10 to 500 Angstroms. The top electrode 28 may be aluminum copper alloy in one embodiment with a thickness in the range of 200 to 20,000 Angstroms. The use of a barrier layer 26 may reduce the incorporation of species from the top electrode 28 into the phase change material 18 in some embodiments. The top electrode 28 and barrier layer 26 may be patterned using standard photolithographic and dry etching techniques to achieve the structures shown in FIGS. 1, 2, and 3.

In accordance with some embodiments of the present invention, a wider selection of lower electrode 14 material is made available by providing a technique for limiting the exposure of the lower electrode 14 to other process steps or to the open environment. As a result, a purer, less contaminated lower electrode 14 may be achieved in some embodiments, achieving more consistent, predictable device operation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming an electrically insulating protective layer over a conductive lower electrode of a phase change memory;
   forming a pore over said insulating protective layer;
   etching through said pore to open up said protective layer;
   forming a chalcogenide in said pore touching said lower electrode; and
   depositing the lower electrode and covering the lower electrode with a protective layer in the same chamber without venting back to the atmosphere.

2. The method of claim 1 including forming the protective layer of an insulator.

3. The method of claim 2 including forming the protective layer of a material in the form of silicon nitride.

4. The method of claim 3 including forming the silicon nitride in the form of $Si_3N_4$.

* * * * *